(12) United States Patent
Takayama et al.

(10) Patent No.: US 8,587,117 B2
(45) Date of Patent: Nov. 19, 2013

(54) STACKED SEMICONDUCTOR CHIPS HAVING CIRCUIT ELEMENT PROVIDED WITH EACH OF THE SEMICONDUCTOR CHIPS

(75) Inventors: Shinichi Takayama, Tokyo (JP); Kazuo Ono, Hachioji (JP); Tomonori Sekiguchi, Richmond (GB); Akira Kotabe, Hino (JP); Yoshimitsu Yanagawa, Musashino (JP)

(73) Assignee: Elpida Memory, Inc., Tokyo (JP)

( * ) Notice: Subject to any disclaimer, the term of this patent is extended or adjusted under 35 U.S.C. 154(b) by 14 days.

(21) Appl. No.: 13/455,171

(22) Filed: Apr. 25, 2012

(65) Prior Publication Data

US 2012/0267792 A1 Oct. 25, 2012

(30) Foreign Application Priority Data

Apr. 25, 2011 (JP) ................................. 2011-097066

(51) Int. Cl.
*H01L 23/34* (2006.01)

(52) U.S. Cl.
USPC .......................................... 257/723; 257/724

(58) Field of Classification Search
USPC ................................................. 257/723, 724
See application file for complete search history.

(56) References Cited

U.S. PATENT DOCUMENTS

| 7,531,905 B2 | 5/2009 | Ishino et al. | |
| 7,869,240 B2 * | 1/2011 | Shimizu et al. | 365/51 |
| 2003/0122240 A1 * | 7/2003 | Lin et al. | 257/686 |
| 2005/0082664 A1 * | 4/2005 | Funaba et al. | 257/724 |
| 2007/0181991 A1 | 8/2007 | Ishino et al. | |
| 2008/0150359 A1 | 6/2008 | Yamada | |
| 2010/0164094 A1 * | 7/2010 | Chung | 257/723 |
| 2011/0031598 A1 * | 2/2011 | Lee et al. | 257/686 |

FOREIGN PATENT DOCUMENTS

| JP | 2007-194444 | 8/2007 |
| JP | 2008-159736 | 7/2008 |

* cited by examiner

*Primary Examiner* — Ngan Ngo
(74) *Attorney, Agent, or Firm* — Young & Thompson

(57) ABSTRACT

A stacked device includes a plurality of semiconductor chips connected to each other by through electrodes. The same number of through electrodes are included in each of paths extending from a first power source terminal through each of circuit elements formed for the semiconductor chips to a second power source terminal.

10 Claims, 6 Drawing Sheets

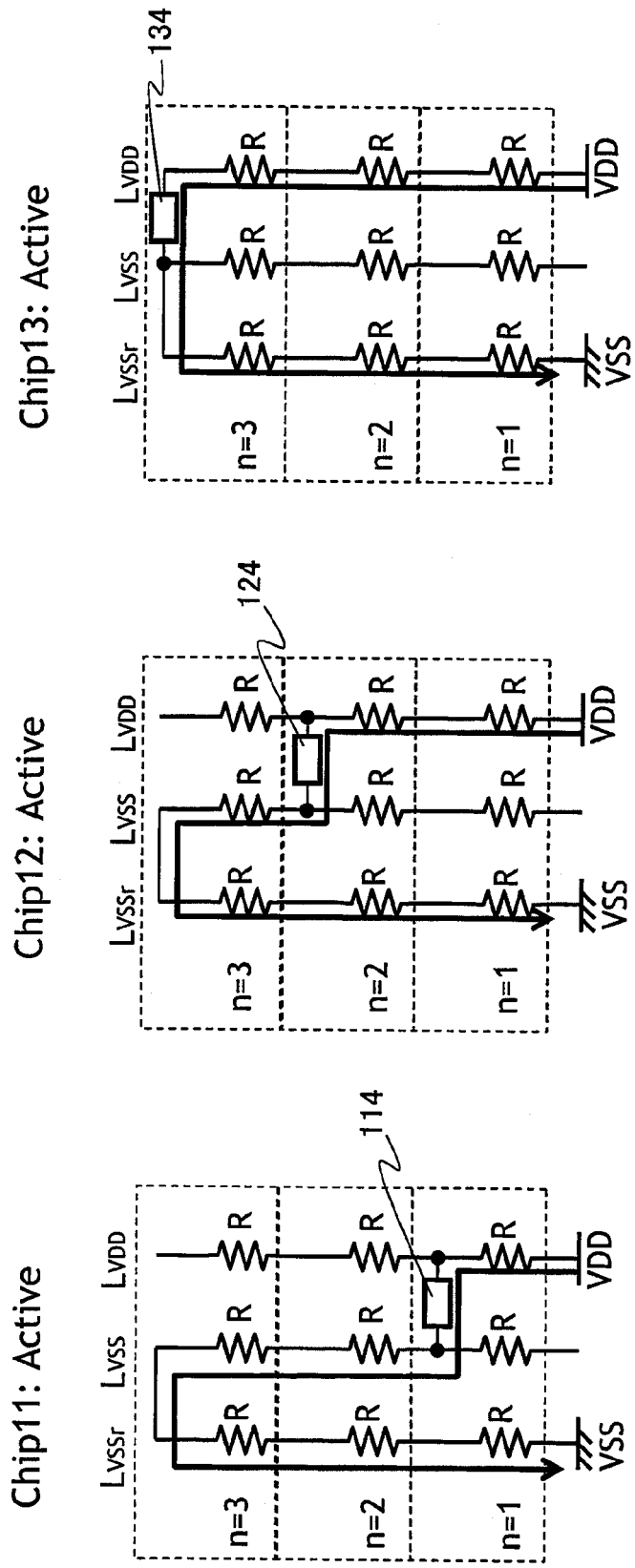

STACKED SEMICONDUCTOR CHIPS HAVING CIRCUIT ELEMENT PROVIDED WITH EACH OF THE SEMICONDUCTOR CHIPS

This application is based upon and claims the benefit of priority from Japanese patent application No. 2011-97066, filed on Apr. 25, 2011, the disclosure of which is incorporated herein in its entirety by reference.

BACKGROUND OF THE INVENTION

1. Field of the Invention

The present invention relates to a semiconductor device, and more particularly to a stacked semiconductor device in which a plurality of semiconductor chips are stacked.

2. Description of the Related Art

In a stacked semiconductor device in which a plurality of semiconductor chips are stacked, electric power is supplied to the respective semiconductor chips from power source terminals formed on a semiconductor chip located on one side of the stacked semiconductor device in a stacking direction of the semiconductor chips (i.e., the uppermost semiconductor chip or the lowermost semiconductor chip). For the power supply, through electrodes are formed so as to extend through semiconductor substrates of those semiconductor chips.

For example, the through electrodes formed in the respective semiconductor chips are connected in series to each other in the stacking direction of the semiconductor chips. Ends of those through electrodes are connected to the power source terminals to produce power supply lines. Thus, a pair of power supply lines is produced. A circuit element (or a functional circuit) is formed on each of the semiconductor chips. The circuit elements formed on the respective semiconductor chips are connected in parallel to each other between those power supply lines. Thus, electric power can be supplied to the circuit elements formed on the semiconductor chips.

With the above configuration, however, a voltage drop is caused by the electric resistance of the through electrodes. As a circuit element of a semiconductor chip is located farther away from the power source terminals, a power source voltage supplied to that circuit element decreases. The electric resistance of through electrodes tends to increase because the diameter of through electrodes is reduced according to miniaturization of a semiconductor device and progress of technology. Therefore, such a drop of the power source voltage is not negligible.

In order to prevent a drop of a power source voltage as described above, a related semiconductor device uses a loop structure in which power source lines formed on a semiconductor chip located on another side of the stacked semiconductor device in the stacking direction of semiconductor chips are connected to the corresponding power source terminals by bonding wires. See, e.g., JP-A 2007-194444 (Patent Literature 1).

Furthermore, in another related semiconductor device, internal components of semiconductor chips are connected in series between a power source voltage and a ground voltage by using through electrodes. An intermediate voltage that corresponds to a stacked location of a semiconductor chip is supplied as a high potential power source to the respective internal components. See, e.g., JP-A 2008-159736 (Patent Literature 2).

The semiconductor device disclosed in Patent Literature 1 requires a space for arranging the bonding wires. Therefore, it is difficult to reduce the size and thickness of the semiconductor device.

Furthermore, the semiconductor device disclosed in Patent Literature 2 requires power source terminals and through electrodes for supplying the intermediate voltage in proportion to the number of the stacked semiconductor chips. Therefore, the number of power source terminals and through electrodes increases as the number of the stacked semiconductor chips increases. Thus, the configuration of the semiconductor device becomes complicated.

SUMMARY

In one embodiment, there is provided a device comprising:
a plurality of semiconductor chips connected to each other by through electrodes;
a circuit element provided with each of the semiconductor chips;
a first power source terminal; and
a second power source terminal;
wherein the same number of through electrodes are included in each of paths extending from the first power source terminal through each of the circuit elements to the second power source terminal.

In another embodiment, there is provided a device comprising:
a plurality of semiconductor chips stacked in a stacking direction, each of the semiconductor chips including a circuit element, a first through electrode and a second through electrode connected to the circuit element, and a third through electrode,
wherein the first through electrode, the second through electrode, and the third through electrode are respectively connected to the first through electrode, the second through electrode, and the third through electrode formed in an adjacent semiconductor chip in the stacking direction so as to form a first power supply path, a second power supply path, and a third power supply path, respectively,
one of the first power supply path and the second power supply path is connected to a first power source terminal provided for the semiconductor chip located on a first side of the device in the stacking direction,
the third power supply path is connected to a second power source terminal provided for the semiconductor chip located on the first side in the stacking direction, and
the third power supply path is connected to an end of the second power supply path on the semiconductor chip located on a second side of the device in the stacking direction.

BRIEF DESCRIPTION OF THE DRAWINGS

The above features and advantages of the present invention will be more apparent from the following description of certain preferred embodiments taken in conjunction with the accompanying drawings, in which

FIGS. 2A to 2C are diagrams showing a feed path to a circuit element included in each of semiconductor chips of the semiconductor device shown in FIG. 1.

DESCRIPTION OF EXEMPLARY EMBODIMENTS

The present invention will be now described herein with reference to illustrative exemplary embodiments. Those skilled in the art will recognize that many alternative embodiments can be accomplished using the teachings of the present invention and that the invention is not limited to the exemplary embodiments illustrated for explanatory purposes.

According to exemplary embodiments of the present invention, a semiconductor device that can supply substantially the same power source voltage to a plurality of semiconductor chips being stacked can be produced with a relatively simple structure without use of bonding wires or need for the corresponding number of power source terminals and through electrodes to the semiconductor chips.

Exemplary embodiments of the present invention will be described below in detail with reference to FIGS. 1 to 7B.

Figure 1:
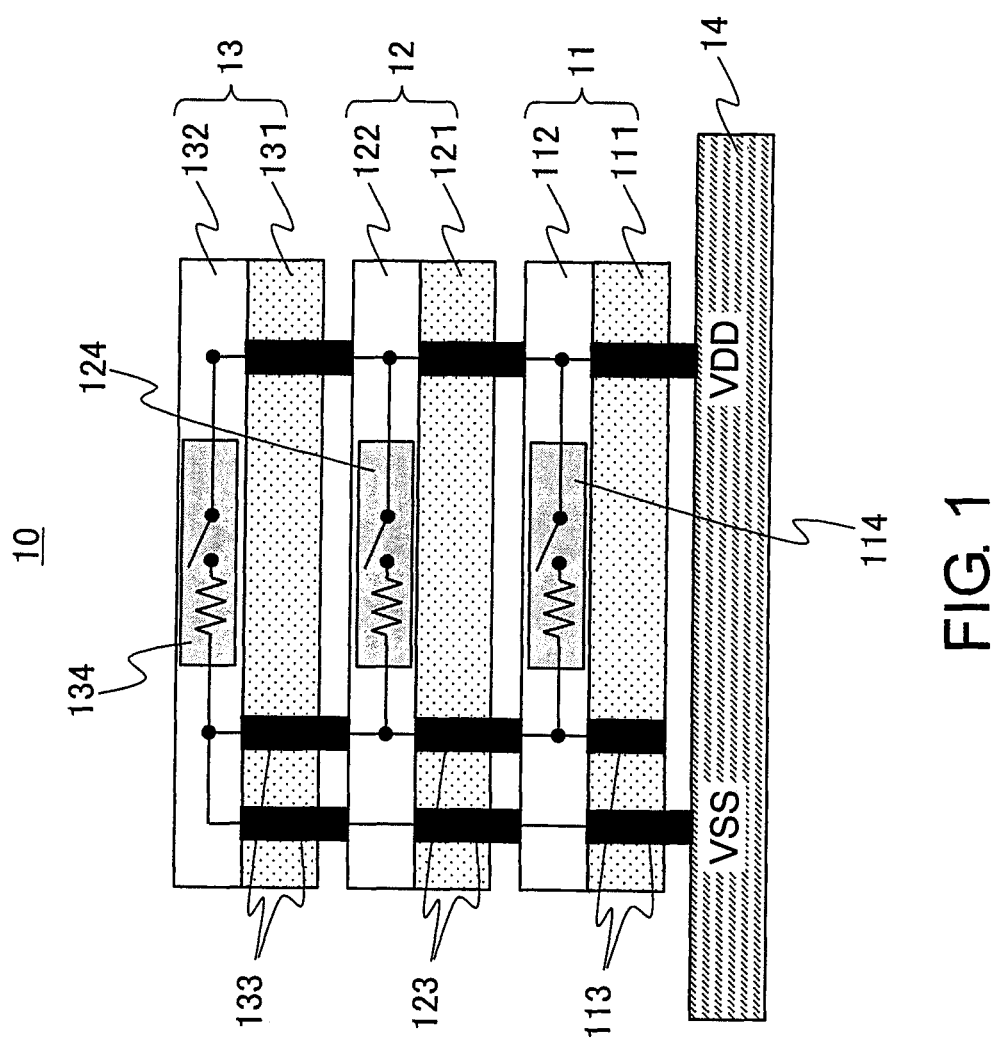
FIG. 1 is a schematic view showing a configuration of a semiconductor device according to an embodiment of the present invention.

FIG. 1 is a schematic view showing a configuration of a semiconductor device according to a first exemplary embodiment of the present invention. The illustrated semiconductor device 10 has a plurality of semiconductor chips, which are stacked in a vertical direction (stacking direction) so as to form a multilayered structure. In the illustrated example, three semiconductor chips 11, 12, and 13 are stacked. Nevertheless, the number of semiconductor chips being stacked is not limited to three. Two or more semiconductor chips may be stacked. The three semiconductor chips 11, 12, and 13 preferably operate exclusively with respect to each other.

The semiconductor device 10 also has a wiring substrate 14, on which the stacked semiconductor chips 11, 12, and 13 are mounted. The wiring substrate 14 may be a circuit board or an interposer.

Each of the semiconductor chips 11, 12, and 13 includes a semiconductor substrate 111, 121, or 131 and a device/wiring layer 112, 122, or 132 formed on the semiconductor substrate 111, 121, or 131. Preferably, the three semiconductor chips 11, 12, and 13 are configured such that substantially the same currents flow upon operation. More preferably, the three semiconductor chips 11, 12, and 13 have substantially the same configuration.

For example, the semiconductor substrates 111, 121, and 131 may be a silicon substrate. A plurality of through electrodes (through silicon vias (TSVs)) 113, 123, and 133 are respectively formed in the semiconductor substrates 111, 121, and 131 so as to extend through those semiconductor substrates 111, 121, and 131. In the illustrated example, three through electrodes are formed in each of the silicon substrates so as to correspond to a pair of power source terminals. If a plurality of pairs of power source terminals are provided, three through electrodes may be formed so as to correspond to each pair of power source terminals. Furthermore, a through electrode may be formed so as to correspond to each of signal terminals.

Each of the device/wiring layers 112, 122, and 132 includes a circuit element 114, 124, or 134 and wires connecting the circuit element 114, 124, or 134 to the through electrodes. In the illustrated example, each of the circuit elements includes a resistance and a switch. Nevertheless, the circuit elements may include any functional circuit. Such a functional circuit may include various logic circuits, memory, and the like. Furthermore, the circuit elements 114, 124, and 134 may have the same configuration or may have different configurations.

Each of the semiconductor chips 11, 12, and 13 is electrically connected to an underlying semiconductor chip or the wiring substrate 14 with solder bumps (microbumps) provided on ends (lower ends in FIG. 1) of the through electrodes. The through electrodes formed in the respective semiconductor chips are connected in series to each other in the stacking direction of the semiconductor chips. For example, the through electrodes form first, second, and third power supply lines from the right side of FIG. 1. Thus, the semiconductor chips 11, 12, and 13 and the wiring substrate 14 are electrically connected to each other by those through electrodes.

In FIG. 1, the through electrodes 113, 123, and 133 are illustrated as being positioned at the same locations in the lowermost semiconductor chip 11, the intermediate semiconductor chip 12, and the uppermost semiconductor chip 13. Those through electrodes may not necessarily be positioned at the same location in the semiconductor chips. Nevertheless, if through electrodes connected to each other are located at the same location of the semiconductor chips, it is possible to use a common TSV mask (photomask) for forming the through electrodes and to shorten the wire length.

The lowermost semiconductor chip 11 has two solder bumps, which are used as a pair of electrode terminals. One of the three through electrodes 113, 123, or 133 in each of the semiconductor chips 11, 12, and 13 (the rightmost through electrode in FIG. 1) is connected to a first terminal of the pair of electrode terminals so as to form a high potential power supply line (first power supply line). Another one of the three through electrodes in each of the semiconductor chips (the central through electrode in FIG. 1) forms a low potential power supply line (second power supply line). The circuit elements 114, 124, and 134 of the semiconductor chips 11, 12, and 13 are connected in parallel to each other between the high potential power supply line and the low potential power supply line.

The remaining through electrodes in the semiconductor chips (the leftmost through electrodes) are connected to the low potential power supply line at the uppermost semiconductor chip 13 and are also connected to a second terminal of the pair of electrode terminals so as to form a return power supply line (third power supply line).

The third power supply line may be connected as a transfer power supply line to the high potential power supply line. In this case, the first terminal of the pair of electrode terminals is connected to the transfer power supply line, not to the high potential power supply line, and the second terminal of the pair of electrode terminals is connected to the low potential power supply line.

Furthermore, the connection between the return power supply line and the low potential power supply line (or the connection between the transfer power supply line and the high potential power supply line) may not necessarily be established in the device/wiring layer of the semiconductor chip 13. In other words, such connection may be established by formation of a connection layer (or a semiconductor chip) on the semiconductor chip 13. Use of the connection layer allows the semiconductor chip 13 to have the same configuration as the other semiconductor chips 11 and 12. Furthermore, a metal mask or the like can be used in common for producing the semiconductor chips.

The wiring substrate 14 has wires and a plurality of electrode pads (not shown) formed thereon. Two of those electrode pads are used as a pair of power source pads and connected to a pair of the power source terminals provided on the semiconductor chip 11 so as to supply a power source voltage (power source potential VDD and ground potential VSS) to the semiconductor device 10.

With the above configuration, the circuit elements 114, 124, and 134 of the semiconductor chips 11, 12, and 13 can be supplied with substantially the same power source voltage. This is because the same number of through electrodes are included in each of power source paths passing through one of the circuit elements 114, 124, and 134 from the first electrode terminal to the second electrode terminal. The details of this configuration will be described below.

In this example, the stacked semiconductor chips 11, 12, and 13 operate selectively. Specifically, the semiconductor chips 11, 12, and 13 operate independently of each other. Two or more semiconductor chips do not operate simultaneously. When each of the semiconductor chips 11, 12, and 13 operates under those conditions, a power source path is formed as shown in FIGS. 2A, 2B, and 2C.

In FIGS. 2A, 2B, and 2C, the through electrodes are illustrated as resistors R. Furthermore, the high potential power supply line and the low potential power supply line are illustrated by $L_{VDD}$ and $L_{VSS}$, respectively. The return power supply line is illustrated by $L_{VSSr}$. As can be seen from FIGS. 2A, 2B, and 2C, the number of through electrodes is six in each of the paths passing through any one of the circuit elements 114, 124, and 134. When all of the through electrodes have an IR drop voltage δ, a power source voltage Vact applied to each of the circuit elements 114, 124, and 134 is given by $$Vact=(VDD-n\delta)-(VSS+(6-n)\delta)=VDD-VSS-6\delta$$

where n is a layer index. Theoretically, the same power source voltage is thus applied to each of the circuit elements 114, 124, and 134.

Next, there will be described an arrangement (in-plane arrangement) of the through electrodes in an in-plane direction of the semiconductor chips, which is perpendicular to the stacking direction of the semiconductor chips.

An inductor component (L) of each of the through electrodes cannot be ignored because of size reduction of the device, enhancement of the operation speed, and the like. Any influences by the L components of the through electrodes can be cancelled when the power supply lines connected to the pair of power source terminals are arranged close to each other.

Figure 3A:
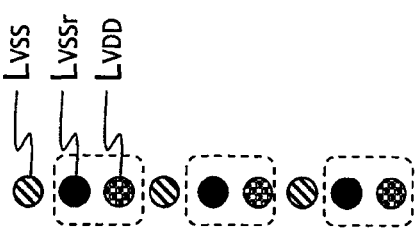
FIGS. 3A and 3B are diagrams explanatory of a first arrangement example of power supply lines in an in-plane direction.

For example, in the case where the return power supply line $L_{VSSr}$ is connected to the low potential power supply line $L_{VSS}$, the high potential power supply line $L_{VDD}$ and the return power supply line $L_{VSSr}$ are located adjacent to each other as shown in FIG. 3A.

Figure 3B:
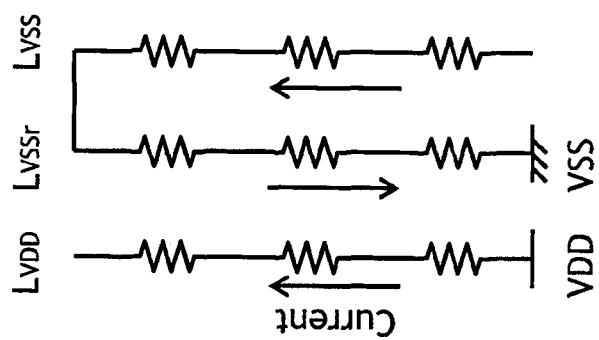

For example, if there are a plurality of sets of power supply lines including the high potential power supply line $L_{VDD}$, the low potential power supply line $L_{VSS}$, and the return power supply line $L_{VSSr}$, then a plurality of through electrodes are arranged in a row in each of the semiconductor chips, as shown in FIG. 3B, such that through electrodes of the low potential power supply lines $L_{VSS}$, through electrodes of the return power supply lines $L_{VSSr}$, and through electrodes of the high potential power supply lines $L_{VDD}$ are repeated in the order named along the in-plane direction.

In the configuration of FIG. 3B, currents having the same magnitude flow through the high potential power supply lines $L_{VDD}$ and the return power supply lines $L_{VSSr}$, which are encircled by broken lines, in opposite directions within an operating semiconductor chip. Therefore, L components of the through electrodes included in those power supply lines are cancelled. Accordingly, generation of noise caused by L components can be prevented.

Meanwhile, no current flows through the low potential power supply line $L_{VSS}$ in the operating semiconductor chip (see FIGS. 2A to 2C). When a plurality of sets of power supply lines are arranged in a row as shown in FIG. 3B, a low potential power supply line $L_{VSS}$ is located between a high potential power supply line $L_{VDD}$ in an adjacent set and a return power supply line $L_{VSSr}$ in the same set. Therefore, those low potential power supply lines $L_{VSS}$ serve to electromagnetically shield between adjacent sets of power supply lines. Furthermore, with this configuration, L components of the through electrodes of the power supply lines $L_{VSS}$ and the transfer power supply lines $L_{VSSr}$ can be cancelled on the semiconductor chip located on the operating semiconductor chip. Accordingly, generation of noise caused by L components can be prevented.

Figure 4A:
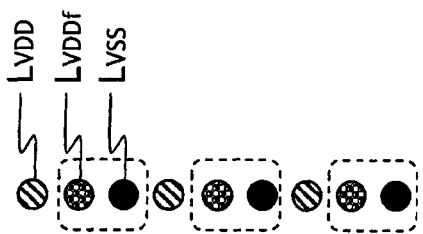
FIGS. 4A and 4B are diagrams explanatory of a second arrangement example of power supply lines in the in-plane direction.

In the case where a transfer power supply line $L_{VDDf}$ is connected to the high potential power supply line $L_{VDD}$, the low potential power supply line $L_{VSS}$ and the transfer power supply line $L_{VDDf}$ are located adjacent to each other as shown in FIG. 4A.

Figure 4B:
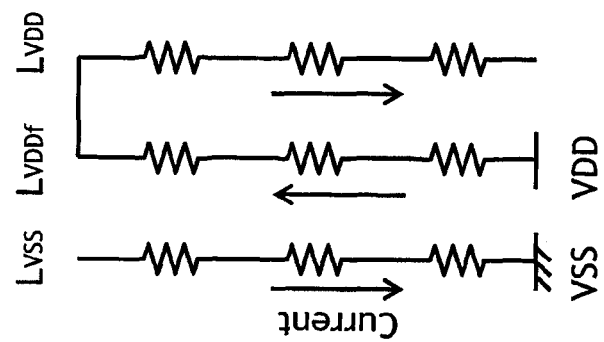
Figure 5:
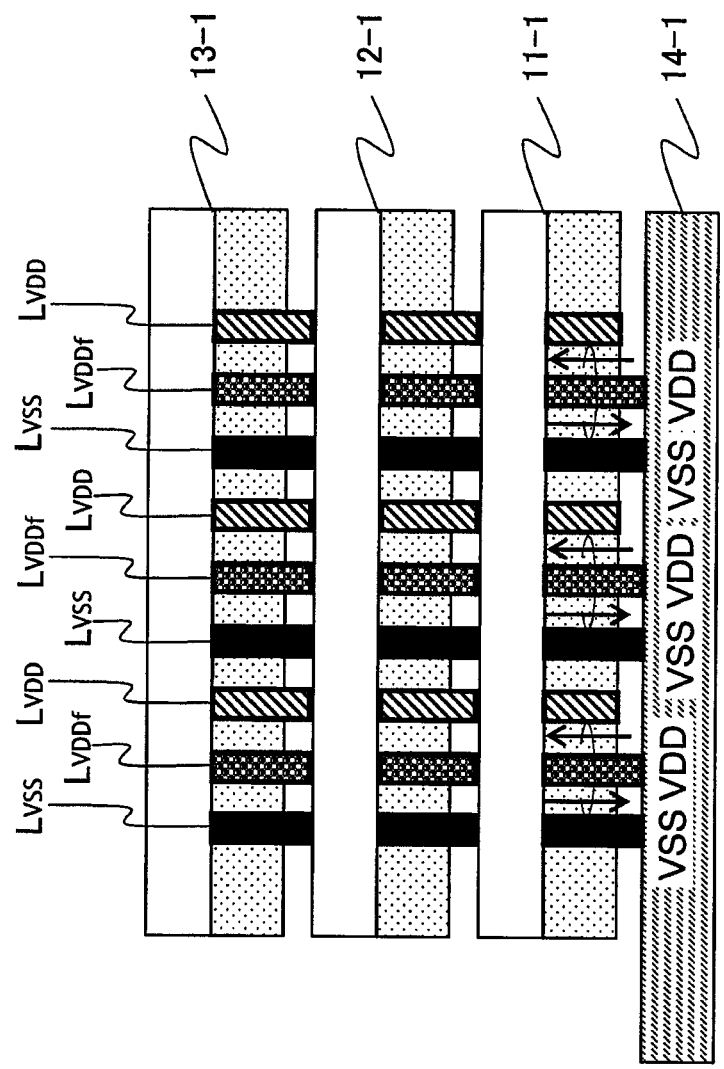
FIG. 5 is a vertical cross-sectional view schematically showing a semiconductor device using the second arrangement example of the power supply lines shown in FIG. 4B.

If there are a plurality of sets of power supply lines including the low potential power supply line $L_{VSS}$, the high potential power supply line $L_{VDD}$, and the transfer power supply line $L_{VDDf}$, then a plurality of through electrodes are arranged in a row in each of the semiconductor chips, as shown in FIG. 4B, such that through electrodes of the high potential power supply lines $L_{VDD}$, through electrodes of the transfer power supply lines $L_{VDDf}$, and through electrodes of the low potential power supply line $L_{VSS}$ are repeated in the order named along the in-plane direction. FIG. 5 is a vertical cross-sectional view of a semiconductor device having such a configuration. In FIG. 5, three semiconductor chips 11-1, 12-1, and 13-1 are stacked on a wiring substrate 14-1. Circuit elements, wires, and the like are omitted from the illustration.

In the configuration of FIGS. 4B and 5, currents having the same magnitude flow through the transfer power supply lines $L_{VDDf}$ and the low potential power supply lines $L_{VSS}$ in opposite directions within an operating semiconductor chip. Therefore, inductor components of the through electrodes included in those power supply lines are cancelled. Furthermore, the high potential power supply lines $L_{VDD}$ serve to electromagnetically shield between adjacent sets of power supply lines. Furthermore, with this configuration, L components of the through electrodes of the power supply lines $L_{VDD}$ and the transfer power supply lines $L_{VDDF}$ can be cancelled on the semiconductor chip located on the operating semiconductor chip. Accordingly, generation of noise caused by L components can be prevented.

Figure 6:
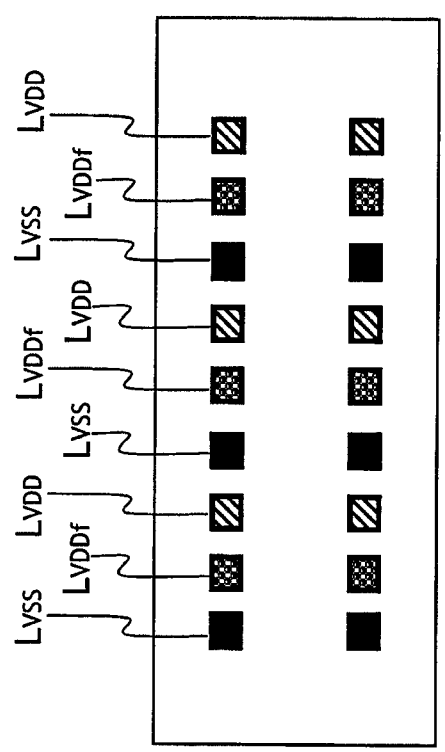
FIG. 6 is a diagram explanatory of a third arrangement example of power supply lines in the in-plane direction.

In the above example, a plurality of through electrodes are formed in a row along the in-plane direction of each of the semiconductor chips. However, a plurality of through electrodes may be formed in two rows as shown in FIG. 6 or, alternatively, in three or more rows.

In the above example, three power supply lines in each set are arranged at equal intervals. However, power supply lines connected to the pair of power source terminals may be arranged close to each other, and the remaining power supply line may be arranged away from those two power supply lines.

Figure 7A:
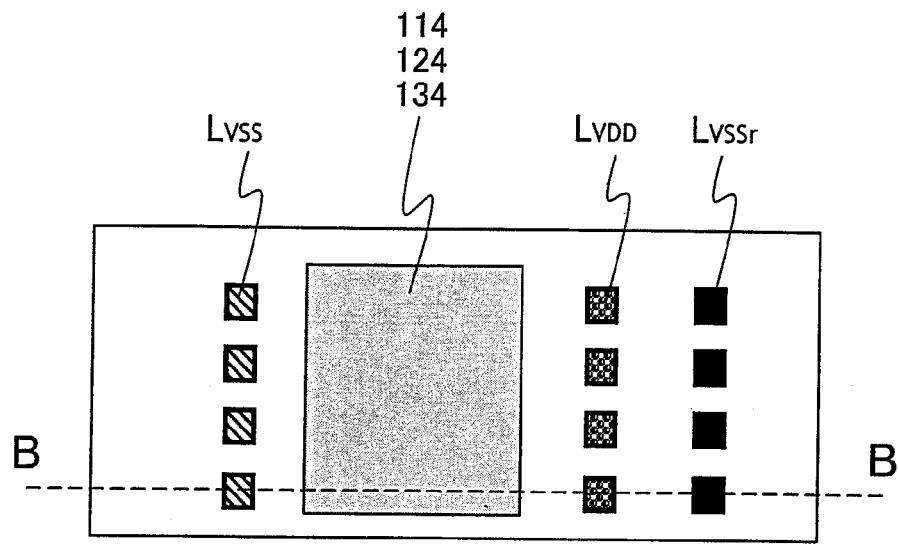
FIG. 7A is a diagram explanatory of an arrangement example of power supply lines in an in-plane direction of a semiconductor device according to another embodiment of the present invention.
Figure 7B:
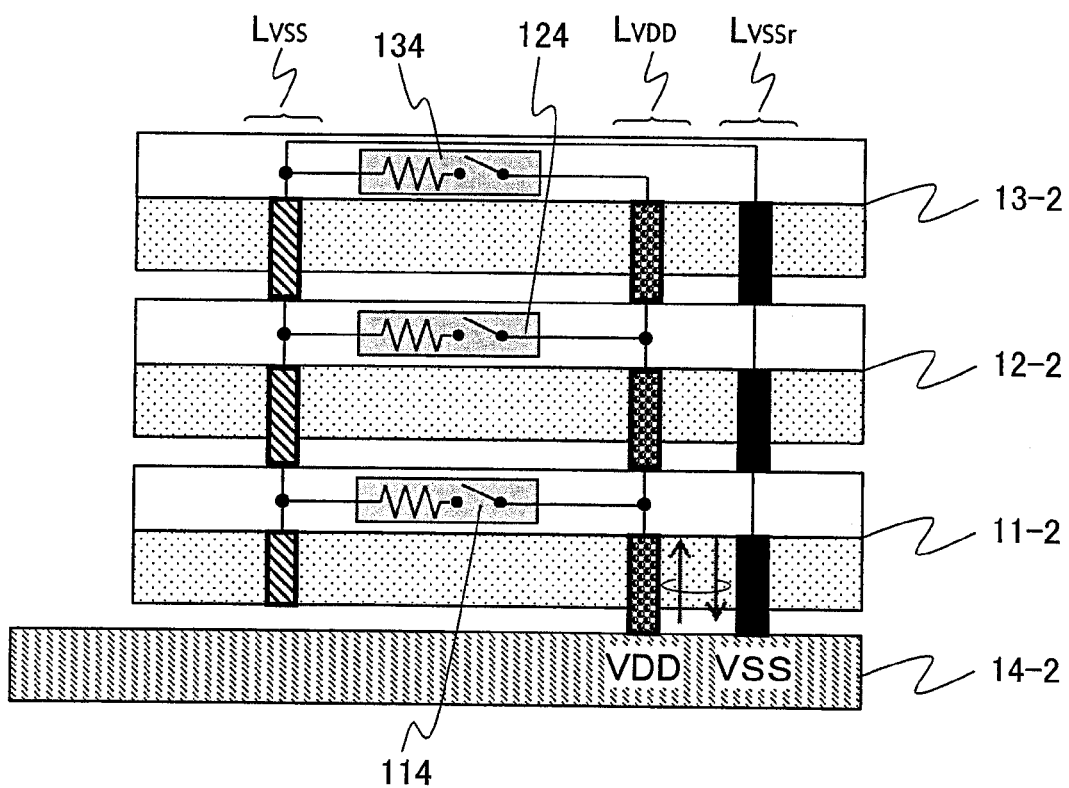
FIG. 7B is a vertical cross-sectional view schematically showing a semiconductor device according to still another embodiment of the present invention.

For example, as shown in FIGS. 7A and 7B, high potential power supply lines $L_{VDD}$ and low potential power supply lines $L_{VSS}$ may be arranged on opposite sides of the circuit elements 114, 124, and 134. Return power supply lines $L_{VSSr}$ connected to the low potential power supply lines $L_{VSS}$ may be arranged near the high potential power supply lines $L_{VDD}$. Similarly, in a case where transfer power supply lines $L_{VDDf}$ are connected to the high potential power supply lines $L_{VDD}$, the power supply lines $L_{VDDf}$ may be arranged near the low potential power supply lines $L_{VSS}$. With this configuration, L components of the through electrodes can be cancelled. Accordingly, generation of noise caused by L components can be prevented.

According to the exemplary embodiment of the present invention, the same number of through electrodes are provided in each of paths extending from a first power source terminal through one of circuit elements on stacked semiconductor chips to a second power source terminal. Therefore, a semiconductor device that can supply substantially the same power source voltage to a plurality of semiconductor chip being stacked can be produced with a relatively simple structure without use of bonding wires or need for the corresponding number of power source terminals and through electrodes to the semiconductor chips.

Although the present invention has been described along with some exemplary embodiments, the present invention is not limited to the above embodiments. It should be understood that various changes and modifications may be made therein without departing from the scope of the present invention.

What is claimed is:

1. A device comprising:
   a plurality of semiconductor chips connected to each other by through electrodes;
   a circuit element provided with each of the semiconductor chips;
   a first power source terminal; and
   a second power source terminal;
   wherein the same number of through electrodes are included in each of paths extending from the first power source terminal through each of the circuit elements to the second power source terminal.

2. The device as recited in claim 1, wherein the through electrodes are connected in series to each other in a stacking direction of the plurality of semiconductor chips so as to form a first power supply line, a second power supply line, and a third power supply line,
   each of the circuit elements is connected in parallel between the first power supply line and the second power supply line,
   the first power source terminal is connected to an end of one of the first power supply line and the second power supply line,
   the end of the one of the first power supply line and the second power supply line is located on a first side of the device in the stacking direction,
   the third power supply line has a first end located on the first side and a second end located on a second side of the device in the stacking direction,
   the first end of the third power supply line is connected to the second power source terminal, and
   the second end of the third power supply line is connected to an end of another one of the first power supply line and the second power supply line.

3. The device as recited in claim 2, wherein the first power supply line, the second power supply line, and the third power supply line are arranged in a row on each of the semiconductor chips along a direction perpendicular to the stacking direction, and
   the through electrodes are formed so that one of the first power supply line and the second power supply line is arranged adjacent to the third power supply line.

4. The device as recited in claim 3, wherein a plurality of sets of power supply lines including the first power supply line, the second power supply line, and the third power supply line are provided,
   the plurality of sets of power supply lines are arranged in a row along the direction perpendicular to the stacking direction, and
   the first power supply line, the second power supply line, and the third power supply line are arranged in the same order in each of the plurality of sets of power supply lines.

5. A device comprising:
   a plurality of semiconductor chips stacked in a stacking direction, each of the semiconductor chips including a circuit element, a first through electrode and a second through electrode connected to the circuit element, and a third through electrode,
   wherein the first through electrode, the second through electrode, and the third through electrode are respectively connected to the first through electrode, the second through electrode, and the third through electrode formed in an adjacent semiconductor chip in the stacking direction so as to form a first power supply path, a second power supply path, and a third power supply path, respectively,
   one of the first power supply path and the second power supply path is connected to a first power source terminal provided for the semiconductor chip located on a first side of the device in the stacking direction,
   the third power supply path is connected to a second power source terminal provided for the semiconductor chip located on the first side in the stacking direction, and
   the third power supply path is connected to an end of another one of the first power supply path and the second power supply path on the semiconductor chip located on a second side of the device in the stacking direction.

6. The device as recited in claim 5, wherein the first through electrode, the second through electrode, and the third through electrode are formed so that the first power supply line, the second power supply line, and the third power supply line are arranged in a row on each of the semiconductor chips along a direction perpendicular to the stacking direction and that one of the first power supply line and the second power supply line is arranged adjacent to the third power supply line.

7. The device as recited in claim 6, wherein a plurality of sets of through electrodes including the first through electrode, the second through electrode, and the third through electrode are provided in each of the semiconductor chips,
   the plurality of sets of through electrodes are arranged in a row along the direction perpendicular to the stacking direction, and
   the first through electrode, the second through electrode, and the third through electrode are arranged in the same order in each of the plurality of sets of through electrodes.

8. A device comprising:
   first and second power supply terminals;
   a plurality of semiconductor chips stacked with each other, each of the semiconductor chip including a circuit element and a plurality of through electrodes; and a plurality of power paths each connecting the first power supply terminal to the second power supply terminal with an intervention of the circuit element of an associated one of the semiconductor chip, the number of through electrodes included in the power paths being equal to each other.

9. The device as claimed in claim 8, wherein the through electrodes of each of the semiconductor chip include first, second and third through electrodes, the first through electrodes of the semiconductor chips are arranged vertically in line to compose a first power supply line, the second through electrodes of the semiconductor chips are arranged vertically in line to compose a second power supply line, the third through electrodes are arranged vertically in line to compose a third power supply line, the circuit element of each of the semiconductor chips is coupled between the first and second power supply line, the first power supply line is coupled to the first power supply terminal, the third power supply line is coupled to the second power supply terminal and to the second power supply line.

10. The device as claimed in claim 9, wherein the third power supply line is coupled to the second power supply terminal at one end thereof and coupled to the second power supply line at the other end thereof.

* * * * *